(12) United States Patent
Mathur et al.

(10) Patent No.: US 6,714,243 B1
(45) Date of Patent: Mar. 30, 2004

(54) COLOR FILTER PATTERN

(75) Inventors: Bimal P. Mathur, Thousand Oaks, CA (US); H. Taichi Wang, Thousand Oaks, CA (US)

(73) Assignee: Biomorphic VLSI, Inc., Thousand Oaks, CA (US)

( * ) Notice: Subject to any disclaimer, the term of this patent is extended or adjusted under 35 U.S.C. 154(b) by 0 days.

(21) Appl. No.: 09/274,413

(22) Filed: Mar. 22, 1999

(51) Int. Cl.$^7$ ................................................. H04N 3/14
(52) U.S. Cl. ........................................................ 348/273
(58) Field of Search ................................ 348/272, 273, 348/274, 276, 277, 279, 280, 281, 282, 283, 308; 757/440

(56) References Cited

U.S. PATENT DOCUMENTS

| | | | | |
|---|---|---|---|---|
| 5,323,233 A | * | 6/1994 | Yamagami et al. | 348/272 |
| 5,786,588 A | * | 7/1998 | Takahashi | 348/272 |
| 5,966,174 A | * | 10/1999 | Yamamoto et al. | 348/273 |
| 6,118,481 A | * | 9/2000 | Hamada | 348/272 |
| 6,366,319 B1 | * | 4/2002 | Bills | 348/273 |

FOREIGN PATENT DOCUMENTS

| | | |
|---|---|---|
| EP | 0757497 | 2/1997 |
| EP | 0926901 | 6/1999 |

\* cited by examiner

Primary Examiner—Wendy R. Garber
Assistant Examiner—Rashawn N Tillery
(74) Attorney, Agent, or Firm—Pillsbury Winthrop LLP

(57) ABSTRACT

A semiconductor imaging sensor utilizes a color filter pattern. The imaging sensor includes light sensitive-elements, each of which is sensitive to photon energy in a spectral region or color band associated with the light-sensitive elements. Select light-sensitive elements in the array are sensitive to energy in a wide band spectral region or "white" color band. This permits the capture of color information which can be lost with the use of typical semiconductor imaging sensors in digital photography. This capture of the additional color information in digital photography allows for better quality of reproduction of an image on a selected medium such as color prints.

23 Claims, 10 Drawing Sheets

COLOR FILTER PATTERN

BACKGROUND

1. Field of the Invention

The present invention relates to digital photography. In particular, the described embodiments relate to the extraction of color information from an image.

2. Related Art

Portable digital cameras and video cameras have become very common in all aspects of everyday life. With the explosion of personal computer technology over the past decade, it is possible to transmit data which is representative of images captured by a digital still camera or video camera in a format recognizable by a personal computer. The image data received at the personal computer may then be manipulated, edited or reproduced on media using a color printer. Digital cameras typically focus a scene or an object through optics onto an imaging array which captures the focused image. Instead of capturing the image on photographic film as in conventional photography, however, a digital camera typically captures the image on a semiconductor imaging sensor which is suited for the capture and reconstruction of color images. Signals representative of the captured image are then transmitted from the semiconductor imaging sensor to a memory for further processing. The processed image may then be transmitted to a personal computer or some other device capable of reproducing the image on a particular medium.

The typical semiconductor imaging sensor absorbs photon energy at various locations leading to the creation of carrier pairs (i.e., electron and hole pairs). Circuitry formed in the semiconductor imaging array stores the charge resulting from the carriers during an exposure period for the semiconductor imaging array. Following the exposure period, the charge stored in the circuitry is read out and processed to reconstruct the image.

The charge is typically collected in the semiconductor substrate by applying an electric field to separate holes and electrons in the carriers. In a charge couple device (CCD) arrangement, a metal oxide semiconductor (MOS) capacitor is formed and an electric field is induced by applying a voltage to a gate of the capacitor. In a CMOS imaging array, a photodiode is formed in the semiconductor having a junction with a built-in field. The photodiode can be reverse biased to further enhance the field.

Once the semiconductor imaging array absorbs photon energy, resulting in the creation of an electron-hole pair, it is not possible to determine the wavelength or the color of light associated with the photon energy. To detect color information, typical imaging sensors control the color of light that is permitted to be absorbed into the substrate. This is achieved in some systems by employing a prism to decompose a full color image into its component colors and using an individual imaging device to collect the image for each of the component colors. This requires precise alignment of the imaging devices and therefore tends to be very costly.

Household video cameras typically use microfilter technology to control the color of light that is allowed to reach any given pixel location. For such a video camera with a semiconductor sensor (or sensing element) array, each detector in the semiconductor imaging array, therefore, is used to detect the intensity of a particular color of light at a particular location in the imaging array. Such filters are typically directly deposited onto each of the light sensing elements formed in the imaging array. The filter color pattern deposited on a given sensing element in the imaging array controls the color of light detected by the particular element.

While camera optics produce an image of a scene which has full color depth at each point in the image, only one color is collected at any particular location. A typical imaging sensor uses red, green and blue as primary colors, including red, green and blue transmissive filters distributed uniformly throughout the imaging array. The intensity of the photon energy collected at each of the pixel locations is typically represented by eight bits at each pixel location. Since much of the light incident at a pixel location is filtered out, color information is lost. Using red, blue and green as the primary colors, the original image would have 24 bits of color data at each location. A color filter pattern using red, blue and green filters deposited at different pixel locations in a specific pattern, known as the Bayer pattern, is discussed in detail in U.S. Pat. No. 3,971,065.

Much color information is lost at any particular pixel location using Bayer pattern. Accordingly, there is a need to provide a cost effective system for extracting additional color information from a semiconductor imaging sensor.

SUMMARY

An object of an embodiment of the present invention is to provide an imaging sensor which is capable of providing high resolution images.

It is another object of an embodiment of the present invention to provide a method and system for capturing additional color information from images in digital photography.

It is another object of an embodiment of the present invention to provide an improved CMOS based imaging sensor.

It is another object of an embodiment of the present invention to provide a low cost digital imaging sensor which can capture color information to more fully exploit color printing technology.

It is yet another object of an embodiment of the present invention to provide an imaging sensor which directly measures color information at pixel locations in a "white" spectral region.

Briefly, embodiments of the present invention are directed to an imaging array comprising a first set of light-sensitive elements and a second set of light-sensitive elements. Each of the first set of light-sensitive elements have a sensitivity to energy in one of a plurality of spectral regions which are substantially distinct from each other. Each of the second set of light-sensitive elements have a sensitivity to energy in a spectral region which includes substantially all of the spectral regions of the first set of light-sensitive elements. The second set of light-sensitive elements are preferably distributed among the first set of light-sensitive elements substantially uniformly throughout the array.

By having the second set of light-sensitive elements, the imaging array is capable of capturing wideband spectral information from an image, in addition to narrower band information captured at the first set of light-sensitive elements. The wideband spectral information provides measurements of the intensity of photo-exposure by "white" light at locations of light-sensitive elements. The wideband spectral information may then be employed to provide a more accurate reproduction of images at, for example, a color printer.

DETAILED DESCRIPTION

Embodiments of the present invention are directed to digital imaging arrays for capturing color information in an image which could not be captured by typical digital imaging arrays. In one embodiment, an imaging array has elements which are sensitive to light in four distinct spectral regions. In further embodiments, the imaging array has a set of elements which are sensitive to light in a wide band color region. These embodiments can be implemented in an imaging array which includes elements which are sensitive to green light, red light, blue light and "white" light. The inclusion of the white pixels provides additional color information which results in improved still and video images which are reproduced at, for example, a multi-color printer or video display.

Figure 1:
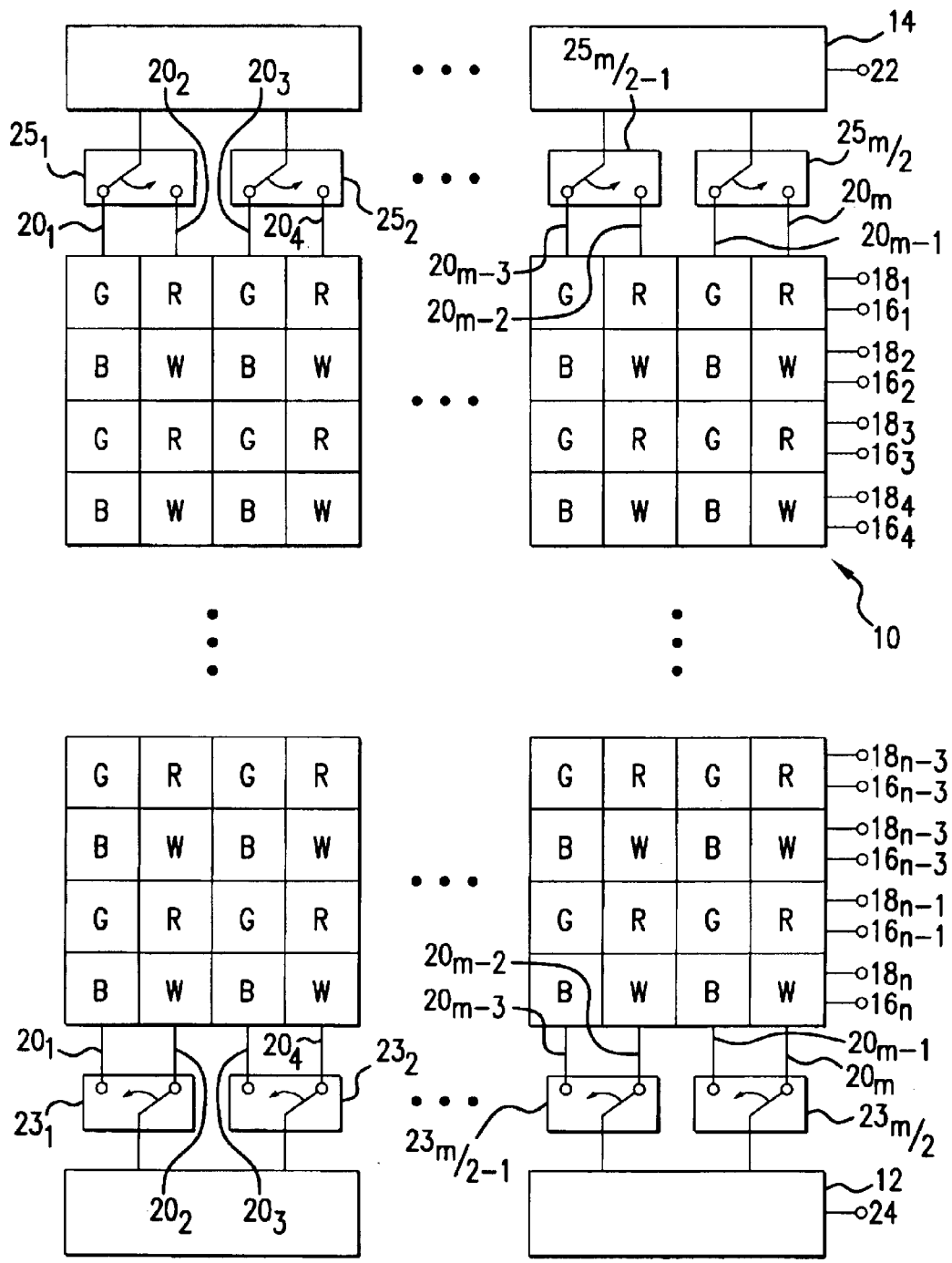
FIG. 1 shows an imaging array with red, green, blue and white pixels coupled to related read-out circuitry according to an embodiment of the present invention.

FIG. 1 illustrates an embodiment of an imaging array 10 which includes red, blue, green and white pixels denoted by the letters R, B, G and W, respectively. The imaging array 10 is an m by n array of light sensitive elements or pixels which are sensitive to energy in individual spectral regions. According to an embodiment, the imaging array 10 has pixels in 1,024 columns a and 768 rows, complying with the XGA standard. Additional rows and columns of pixels may be added to the array to minimize edge effects. However, embodiments of the present invention are not limited to any specific size or dimension of array.

According to an embodiment, the imaging array 10 is exposed to light emitting from an object for an exposure period such as 30 to 25 msec. In an embodiment in which the array 10 is installed in a digital camera, this may take the form of opening and closing a physical shutter to allow focused light passing through a lens to impinge upon individual pixels of the array 10 for the exposure period. Following exposure, signals representative of the photon energy collected during the exposure period at the individual pixels in the array are read out from the array, one row at a time, as discussed below.

According to an embodiment, the imaging array 10 includes a semiconductor substrate into which circuits for detecting the intensity of photon energy over the exposure period are formed. Red, blue, and green pixels (i.e., pixels which are sensitive to light in red, blue and green color bands) are formed by depositing a transmissive filter over the areas corresponding to a pixel. Thus, each of these pixels are sensitive only to photon energy in a corresponding distinct color band or spectral region defined by the transmissive filter. The white pixels, on the other hand, have no transmissive filter deposited over the corresponding area of the substrate. Thus, the sensitivity of a white pixel to photon energy is not limited by any transmissive filter deposit thereon. Rather, the sensitivity to photon energy for such pixels is limited by the absorption characteristics of the semiconductor substrate.

Figure 2:
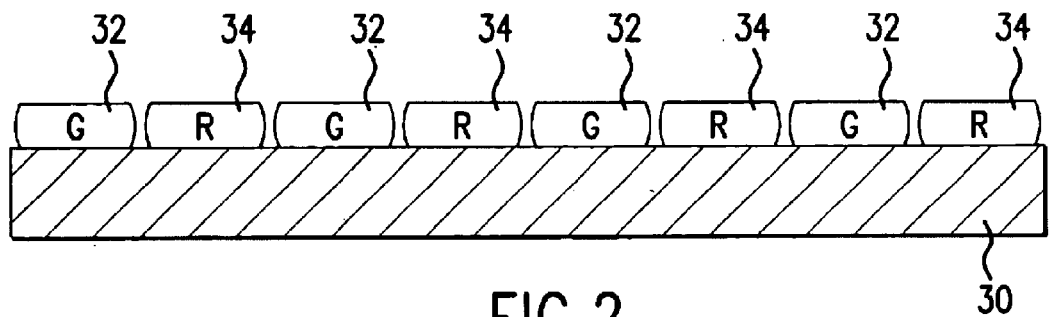
FIG. 2 shows a representative cross-section of an odd row of the imaging array in the embodiment of FIG. 1.
Figure 3:
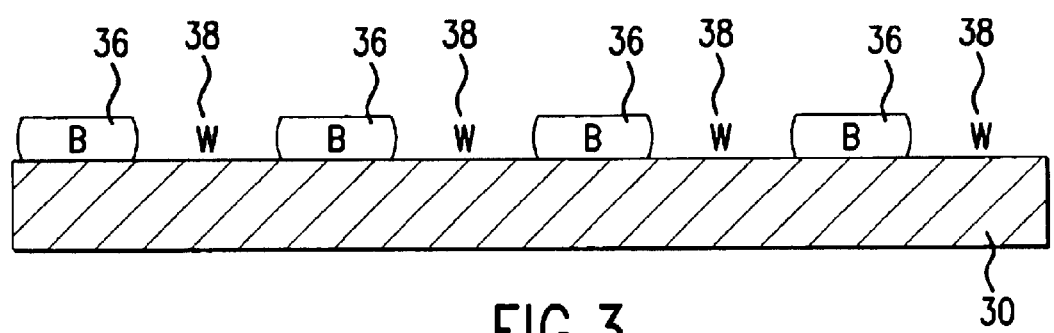
FIG. 3 shows a representative cross-section of an even row of the imaging array in the embodiment of FIG. 1.
Figure 4:
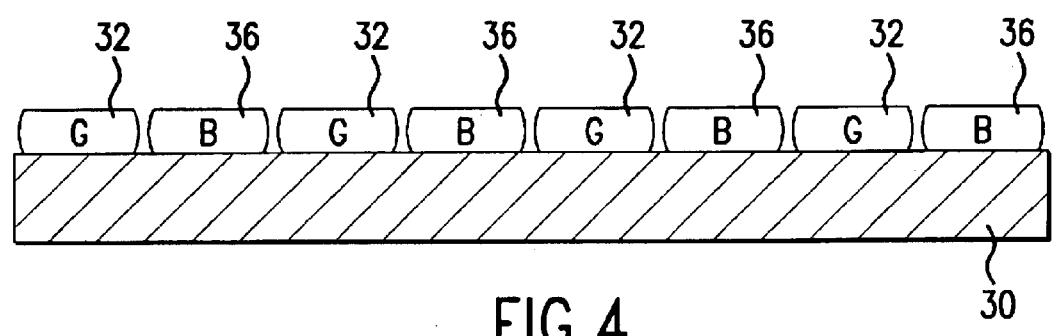
FIG. 4 shows a representative cross-section of an odd column of the imaging array in the embodiment of FIG. 1.
Figure 5:
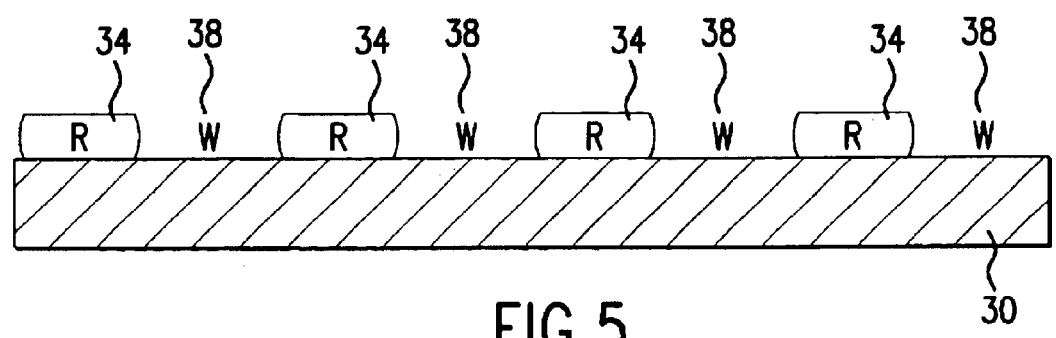
FIG. 5 shows a representative cross-section of an even column of the imaging array in the embodiment of FIG. 1.

FIGS. 2–5 show cross-sections of the imaging array 10 having the transmissive filters deposited on the substrate at various pixel locations. FIG. 2 shows a cross-section through a representative odd row, such as row 1, which includes alternating green and red pixels. Transmissive filters 32 allow substantially only green light to energize the substrate 30 at the green pixel locations. The red transmissive filters 34 permit substantially only red light to energize the substrate 30 at the red pixel locations. FIG. 3 shows a cross-section through even rows, such as row 2, including alternating blue and white pixels. At the blue pixel locations, blue transmissive filter 36 permits substantially only blue light to energize the substrate 30 at the blue pixel locations. At the white pixel locations, absence of any transmissive filter 38 permits all light passing through the optics to energize the substrate 30 at these white pixel locations. FIG. 4 shows a cross-section through a representative odd column, such as column 1, including alternating green and blue pixels created by depositing the green transmissive filters 32 and blue transmissive filters 36. FIG. 5 shows a cross-section of a representative even column, such as column 2, including red and white pixels created by depositing a red transmissive filter 34 at red pixel locations and having an absence of any transmissive filter 38 at white pixel locations. General techniques for depositing transmissive filters on a semiconductor substrate are known to those of ordinary skill in the art.

FIGS. 1 through 5 reflect a pattern of red, blue, green and white pixels in which green and white pixels are always diagonal to each other, and blue and red pixels are always diagonal to each other. Here, green and red pixels are on the same rows and blue and white pixels are on the same rows other patterns may be employed. Another embodiment may be directed to a pattern of pixels in which green pixels and blue pixels are always diagonal to each other, and white pixels and red pixels are always diagonal to each other. Here, the white pixels may be on the same rows as the blue pixels and the green pixels may be on the same rows as the red pixels. The essence of the embodiments shown in FIGS. 1–5 is not limited to a specific pattern of pixels, but to an imaging array 10 which is capable of extracting additional color information from an image projected on to the imaging array 10.

Figure 6A:
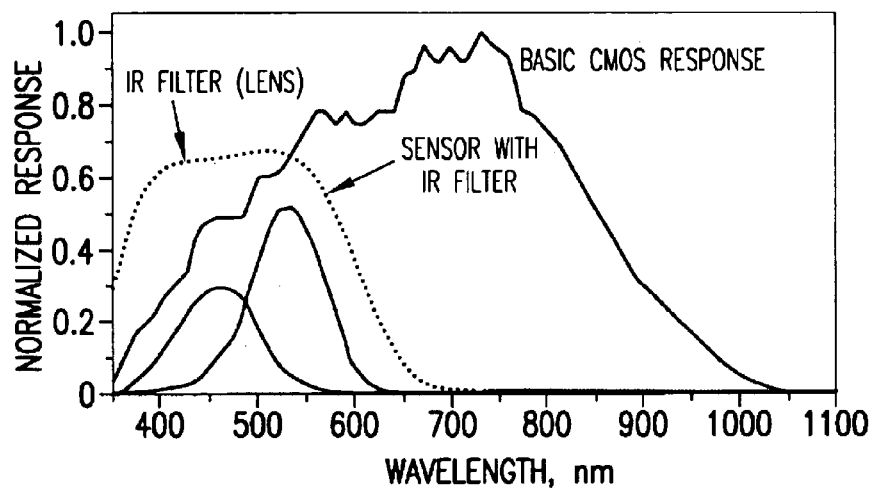
FIGS. 6a and 6b show plots of the photon energy absorption characteristics of the light-sensitive elements in the imaging array of FIG. 1 according to an embodiment.
Figure 6B:
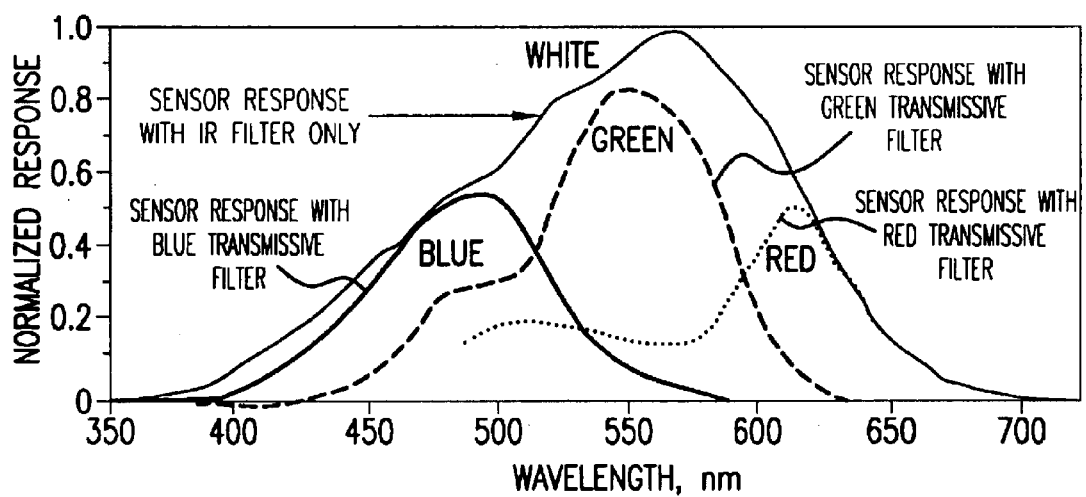

FIGS. 6a and 6b show plots of the absorption characteristics of the blue, red, green and white pixels in the imaging array 10 according to an embodiment with selected red transmissive filters 34, green transmissive filters 32 and blue transmissive filters 36. The response characteristics illustrated in FIGS. 6a and 6b are for an embodiment in which the imaging array 10 is of a CMOS active pixel sensor (APS) type in which the imaging array 10 has a basic CMOS characteristic response to unfiltered light. In preferred embodiments, the imaging array 10 is disposed within a camera (not shown) having a lens (not shown) for focusing light onto the imaging array 10. As illustrated in FIG. 6a, the optical system acts to filter the impinging light, thereby limiting the pixel responses to only photon energy in a given range of wavelengths.

FIG. 6b shows a detailed plot of the absorption characteristics at pixel locations having red transmissive filters 34, green transmissive filters 32, blue transmissive filters 36 and an absence of any transmissive filter 38. As discussed below with reference to FIG. 7, a photodiode at each pixel outputs a voltage representative of the photon energy collected at the photodiode over an exposure period. This voltage is preferably representative of an integration of the photon energy (attenuated according to the characteristics in the associated profile of FIG. 6b) collected over the exposure period. FIG. 6b illustrates that the white pixels are the most responsive to photon energy in the visible spectrum (i.e., photon energy having wavelengths between 400 and 700 nm), followed by the green pixels. As discussed below, the outputs of the pixels are preferably adjusted to normalize output voltages to account for the different levels of response from different colored pixels.

As shown in FIG. 6b, the overlapping spectral regions associated with the red, green and blue pixels are all included as part of the spectral region associated with the white pixels. Therefore, the spectral region associated with the white pixels can be said to include substantially the union of the spectral regions associated with the red, blue and green pixels.

Figure 7:
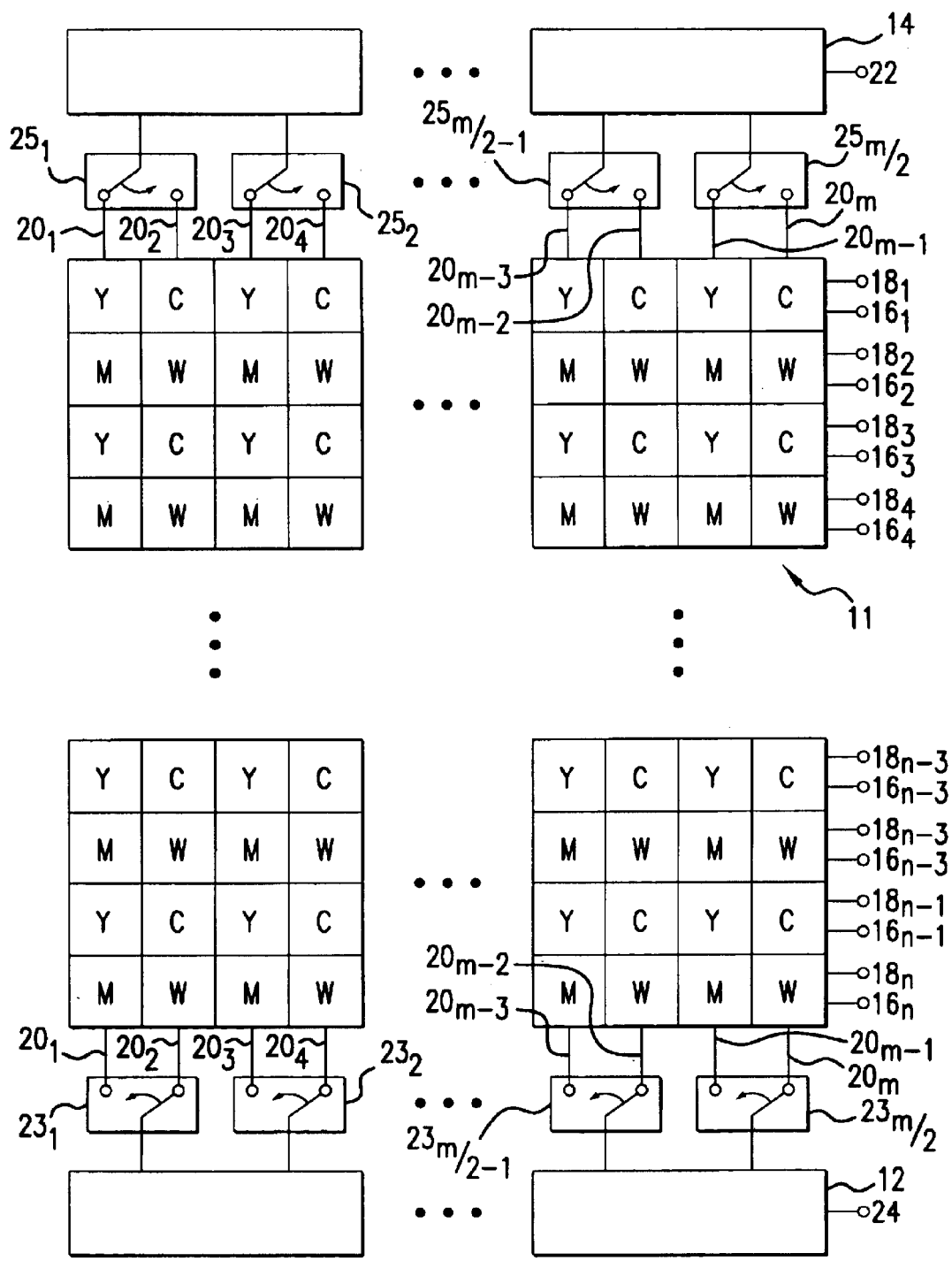
FIG. 7 shows an embodiment of an imaging array with cyan, magenta, yellow and white pixels coupled to related read-out circuitry according to an embodiment of the present invention.

FIG. 7 shows an embodiment of an imaging array 11 which includes cyan, magenta, yellow and white pixels coupled to the scanning readout circuits 12 and 14. Like the imaging array 10, described above with reference to FIGS. 1–5, the imaging array 11 includes a semiconductor substrate upon which transmissive filters are deposited over the non-white pixels. The particular transmissive filters are selected to limit the photon energy reaching the substrate to only photon energy having wavelengths corresponding to a yellow spectral region (at pixel locations denoted with a Y), wavelengths corresponding to a cyan spectral region (at pixel locations denoted with a C) or photon energy having a wavelength corresponding to a magenta spectral region (at pixel locations denoted with an M). Like the imaging array 10, the white pixels (denoted with a W) are formed by maintaining an absence of a transmissive filter over the substrate at the white pixel locations.

The imaging array 11 shows the yellow and white pixels being diagonal and the magenta and cyan pixels being diagonal. Other filter patterns may include having, for example, yellow pixels being diagonal to magenta pixels and cyan pixels being diagonal to white pixels. As discussed above in connection with the imaging array 10, the essence of the embodiment shown in FIG. 7 is not limited to any particular arrangement of the pattern of multispectral pixels in the array 11. Rather, the essence of the embodiment shown in FIG. 7 more generally relates to extracting additional color information from an image projected on to the imaging array 11.

Extracting color information from an object in the cyan, magenta, yellow and white spectral regions directly corresponds with spectral regions associated with the color channels (or different colored inks) of a typical color printer: cyan, magenta, yellow and black. Here, it is understood that the white spectral region of the white pixel is in the imaging array 11 is the complement of the black color channel or ink of the typical color printer. The other spectral regions of the pixels in the imaging array 11 directly correspond with the spectral regions of the other non-black color channels or inks of the typical color printer. This eliminates a need for a transformation of the RGB information (extracted in a typical Bayer pattern imaging array for example) into the CMYB components associated with the channels or inks of the color printer, resulting in a more balanced color image signal being transmitted to the print engine of the color printer. With the imaging array 11, the typical color printer may be able to reproduce the image without a computationally intensive color transformation which may lose some of the color information from the image captured at the typical Bayer pattern imaging array.

Figure 8:
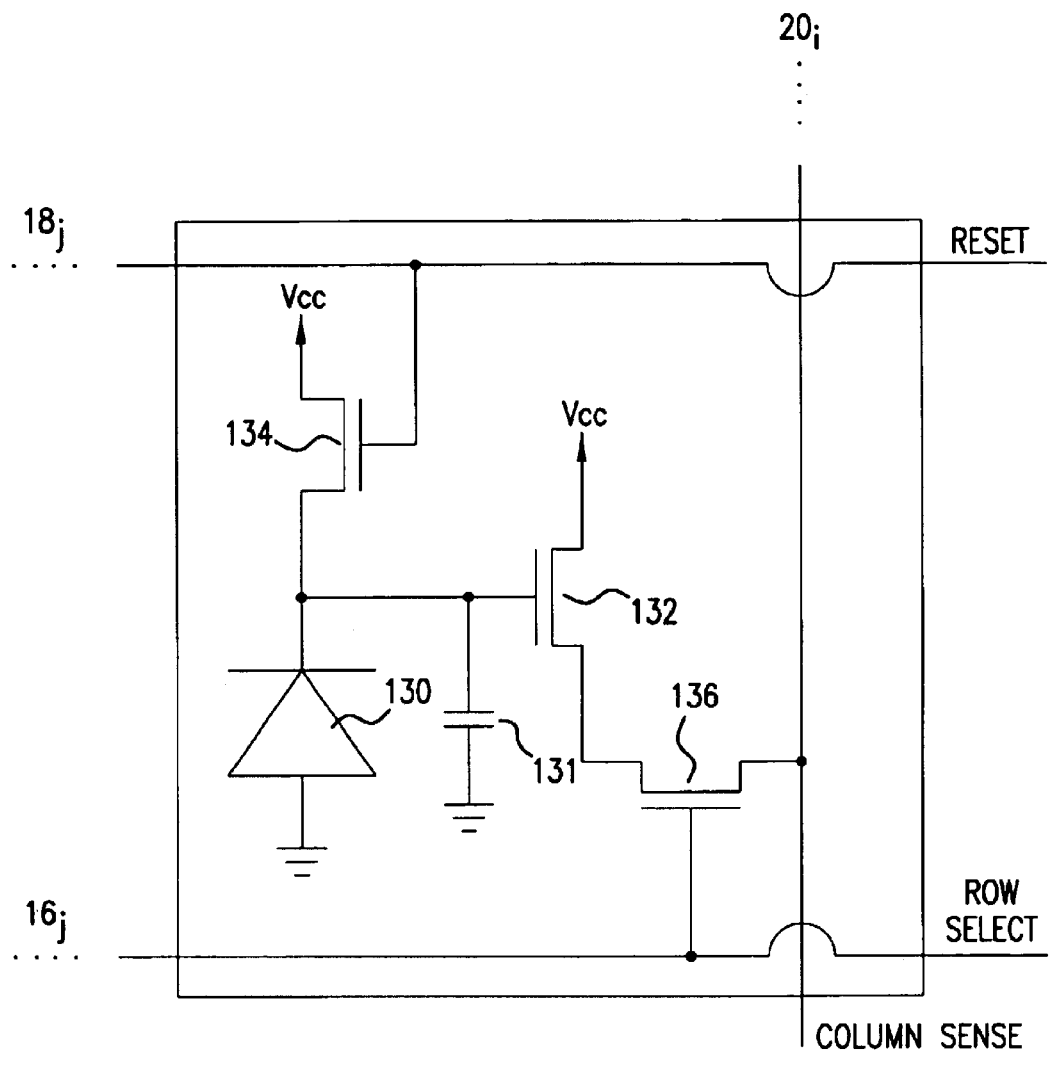
FIG. 8 shows an embodiment of the circuitry formed in the substrate in the location of a light-sensitive element of the imaging array of FIG. 1.

FIG. 8 shows an embodiment of circuitry formed in the substrate 30 (FIGS. 2 through 5) at a representative pixel location. It is understood that similar circuitry can be formed at the pixel locations of the imaging array 11 shown in FIG. 11. Here, each pixel is formed in the substrate 30 according to an active pixel sensor (APS) design in which photon energy is collected at a photodiode 130 (having a parasitic capacitance) and a capacitor 131 over the exposure period. Prior to exposure, the reset line 18 momentarily closes a transistor switch 134. When the transistor switch 134 is closed, the photodiode 130 is reversed biased at an initial voltage. During the exposure period, charge accumulates at the parasitic capacitance of the photodiode 130 and the capacitor 131 in proportion to photon flux incident on the photodiode 130, raising the potential above the reset voltage. This voltage is applied to the gate of a sense transistor 132. Thus, when the row select line 16 is enabled, closing the transistor switch 136, the transistor 132 provides an amplified signal to a column sense line 20 which is representative of the photon flux collected at the photodiode 130 and capacitor 131 during the exposure period. Similar circuits are described in U.S. Pat. Nos. 5,471,515 and 5,587,596.

As discussed above in connection with FIG. 6b, the unfiltered white pixel regions tend to accumulate a disproportionate photon flux as compared with the filtered red, blue and green pixels in the imaging array 10. Thus, the photodiode 130 and capacitor 131 are preferably capable of collecting all of the photon flux during the exposure period over a white pixel without saturation. The photodiode 130 and capacitor 131 are also preferably capable of effectively quantizing the photon flux collected over the exposure period with precision at the diminished photon flux levels at the filtered green, red and blue pixel locations in the imaging array 10 (or at the filtered cyan, magenta and yellow pixel locations in the imaging array 11). It will be understood by those of ordinary skill in the art that sensors with designs other than the APS system shown in FIG. 7 are capable of collecting all of the photon flux at a white pixel (i.e., without saturation), while providing for precise quantization for photon flux collected under the filtered pixels.

In alternative embodiments, to store the additional charge resulting from the higher photon flux at the white pixel locations, the photodiodes formed at the locations of the white pixels may be smaller than the photodiodes formed at the filtered pixel locations (e.g., red, blue and green pixels of the imaging array 10 or cyan, magenta and yellow pixels of the imaging array 11) with the lower photon flux. Alternatively, the sizing of the capacitors 131 can be adjusted. The photon charge collected over an exposure period is related to the area of the pixel and the size of the combined charge collecting capacitance (i.e., the parasite capacitance of the photodiode 130 combined with the capacitance of the capacitor 131). To accommodate the additional charge collected over the unfiltered white pixels, a larger capacitor 131 may be formed at the white pixel locations while maintaining a smaller capacitor 131 at the filtered pixel locations. One of ordinary skill in the art can optimize the APS imaging array by sizing the capacitors 131 at specific pixel locations according to the area of the pixel, the exposure period, whether the pixel is filtered and, if the pixel is filtered, the transmissivity of the filter. Then, transmissive filters may be selectively deposited at pixel locations to provide the above discussed filtering effects, while leaving select white pixel regions unfiltered. The signals representative of the intensity values from the white pixels, having the higher voltages, can be uniformly scaled to a fixed length binary value by applying an appropriate gain at the amplifiers of the scanning readout circuits.

Figure 9:
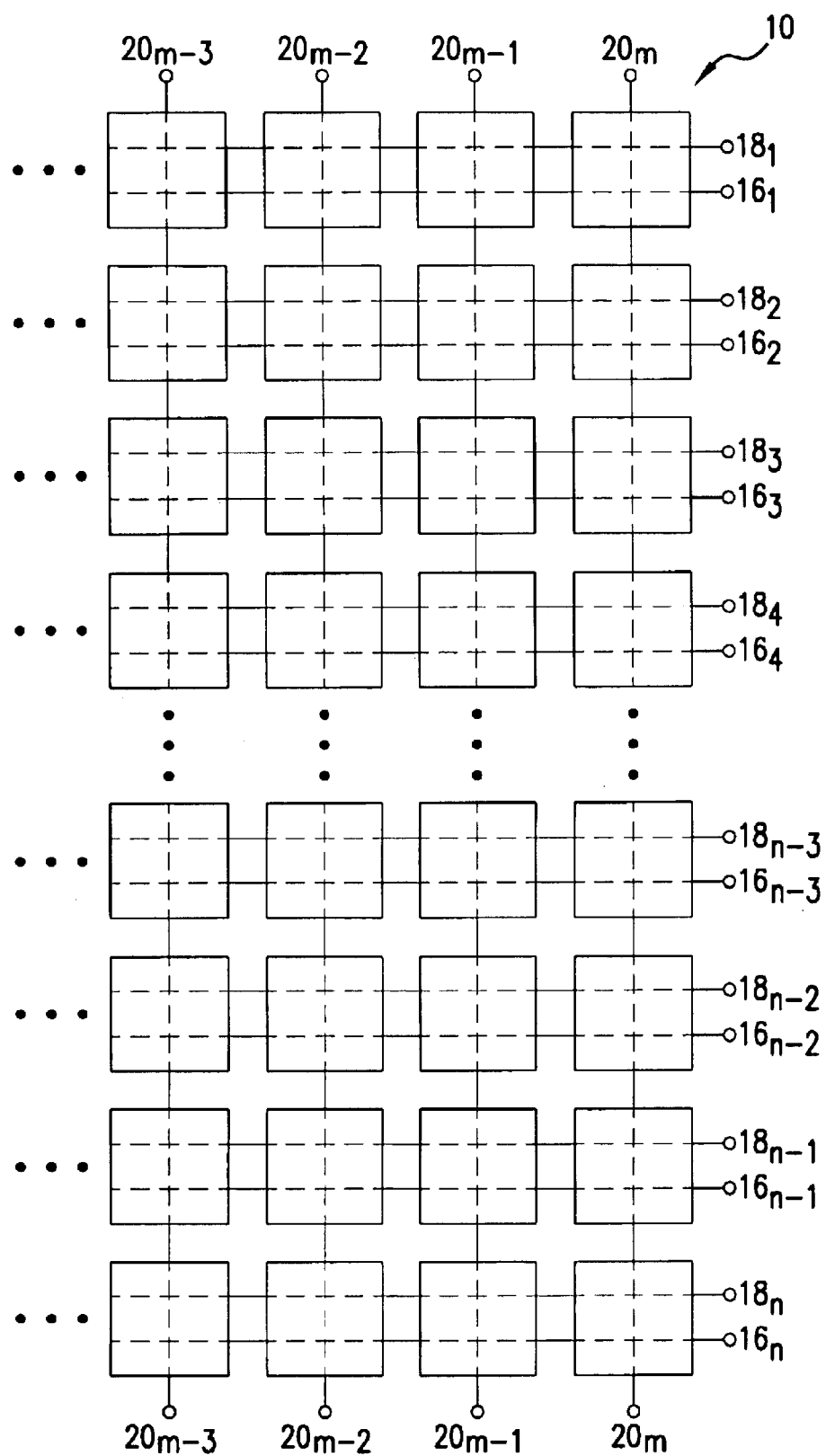
FIG. 9 shows an embodiment of the imaging array of FIG. 1 in which all light-sensitive elements in each column have a common column sense line and all light-sensitive elements in each row have common a row select line and a common reset line.

FIG. 9 shows an embodiment of the imaging array 10 and the imaging array 11 in which each of the column sense lines 20 is coupled continuously through each pixel in its respective column. Similarly, FIG. 9 shows that each of the row select lines 16 is coupled to each of the pixels in the respective row. Each row also has a corresponding reset line 18 as shown. The reset lines are enabled following extraction intervals to reset the pixel elements as described above with reference to FIG. 9.

According to an embodiment, as mentioned above with reference to FIG. 1, intensity values are sampled from each row in the imaging array 10 during extraction intervals, one row at a time. The same technique is preferably applied to sampling intensity values from rows in the imaging array 11 (FIG. 7). During each extraction interval, intensity values are extracted at each of the scanning readout circuits 12 and 14 and quantized into binary data. According to an embodiment, during any particular extraction interval, all of the intensity values extracted at any scanning readout circuit 12 or 14 originate from the same color pixel. Such a system for extracting intensity values is described in U.S. patent application Ser. No. 09/274,424, assigned to Biomorphic VLSI, Inc., the disclosure of which is incorporated herein by reference. For example, in the embodiment illustrated with reference to FIG. 1, the scanning readout circuit 14 extracts intensity values associated with green or white pixels during alternating extraction intervals. During intervals in which intensity values for white pixels are extracted, gain circuitry (see FIG. 11) uniformly adjusts the gain for each of the intensity values of the white pixels to compensate for the disproportionate amount of photon flux collected over the exposure period (because of the absence of any transmissive filter deposited thereon).

Referring to FIGS. 1 and 7, scanning readout circuits 12 and 14 are associated with switches 23 and 25. Switches 23 and 25 couple the scanning readout circuits 12 and 14 to the column sense lines 20. According to an embodiment, switches 23 and 25 alternate from coupling to the column sense lines 20 of adjacent columns. In this manner, all of the intensity values extracted during a particular interval at either of the extraction circuits 12 or 14 originate from pixels of the same color band or spectral region. During any extraction interval, the switches 23 and 25 are coupled to either an even column or an odd column. If the switches 23 are coupled to the odd columns in an extraction interval, for example, the switches 25 are coupled to even columns. Likewise, if the switches 25 are coupled to the column sense lines 20 of odd columns, the switches 23 are coupled to the column sense lines 20 of even columns.

As an example, consider the extraction of photo exposure intensity values of pixels at rows 1 through 4 of the imaging array 10 in successive extraction intervals. In the first extraction interval, row select line 16₁ is enabled so that signals representative of intensity of the photo exposure of the pixels in row 1 are provided to the column sense lines 20 as described above with reference to FIG. 8. The switches 25 are positioned to coupled the odd column sense lines (i.e., column sense lines $20_1$, $20_3$, . . . ) to circuit 14 and the switches 23 are positioned to couple the even column sense lines (i.e., column sense lines $20_2$, $20_4$, . . . ) to circuit 12. Here, the intensity values of all of the green pixels in row 1 are collected at the scanning readout circuit 14, while all of the red pixels in row 1 are extracted at the scanning readout circuit 12. In a subsequent extraction cycle for extracting intensity values from the pixels of row 2, row select line $16_2$ is enabled and the switches 25 are coupled to the column sense lines 20 of the even columns, and the switches 23 are coupled to the column sense lines 20 of the odd columns. Here, the intensity values for all white pixels in row 2 are extracted at the scanning readout circuit 14 and the intensity values for all blue pixels in row 2 are extracted at the scanning readout circuit 12. For the extraction cycle at row 3, the row select line $16_3$ is enabled and the switches 25 couple the odd column sense lines 20 to the scanning readout circuit 14, while the switches 23 couple the even column sense lines 20 to the scanning readout circuit 12. As with the extraction of the intensity values from row 1, intensity values for all of the green pixels in row 3 are extracted at the scanning readout circuit 14, and the intensity values of all of the red pixels in row 3 are extracted at the scanning readout circuit 12. For the extraction at the fourth row, the row select line $16_4$ is enabled and the switches 25 couple the column sense lines 20 of odd columns to the scanning readout circuit 14, and the switches 23 couple the column sense lines 20 of odd columns to the scanning readout circuit 12. As with the extraction of the intensity values at row 2, the intensity values for the white pixels at row 4 are extracted at the scanning readout circuit 14, and the intensity values for the blue pixels in row 4 are extracted at the scanning readout circuit 12.

The intensity values for each of the white pixels are extracted at the scanning readout circuit 14. During alternating extraction intervals, all of the intensity values extracted at the scanning readout circuit 14 are representative of the photon flux collected at white pixels over an exposure period. Scanning readout circuit 14 is preferably coupled to gain circuitry (see FIG. 11) for adjusting the values representative of photo exposure of the white pixels. As discussed below, this gain circuitry preferably uniformly reduces the magnitude of intensity values for white pixels to compensate for the disproportionately high collection of photon flux over the exposure period. In this manner, the intensity values for the white pixels may be effectively quantized into binary data.

The above illustration of extracting intensity values row by row using the scanning readout circuits 12 and 14 was illustrated specifically in connection with extracting intensity values from red, blue, green and white pixels of the imaging array 10 shown in FIG. 1. This extraction technique can also be employed in extracting the intensity values of the cyan, magenta, yellow and white pixels of the imaging array 11 shown in FIG. 7. In connection with the embodiment shown in FIG. 7, in the extraction of intensity values from odd rows, the scanning readout circuit 14 may extract all of the intensity values associated with the yellow pixels in the odd row while the scanning readout circuit 12 extracts all of the intensity values of the cyan pixels in the odd row. Then, on the extraction of the intensity values from the even rows, the scanning readout circuit 14 extracts all of the intensity values of the white pixels in the even row while the scanning readout circuit 12 extracts all of the intensity values of the magenta pixels in the even row.

Figure 10A:
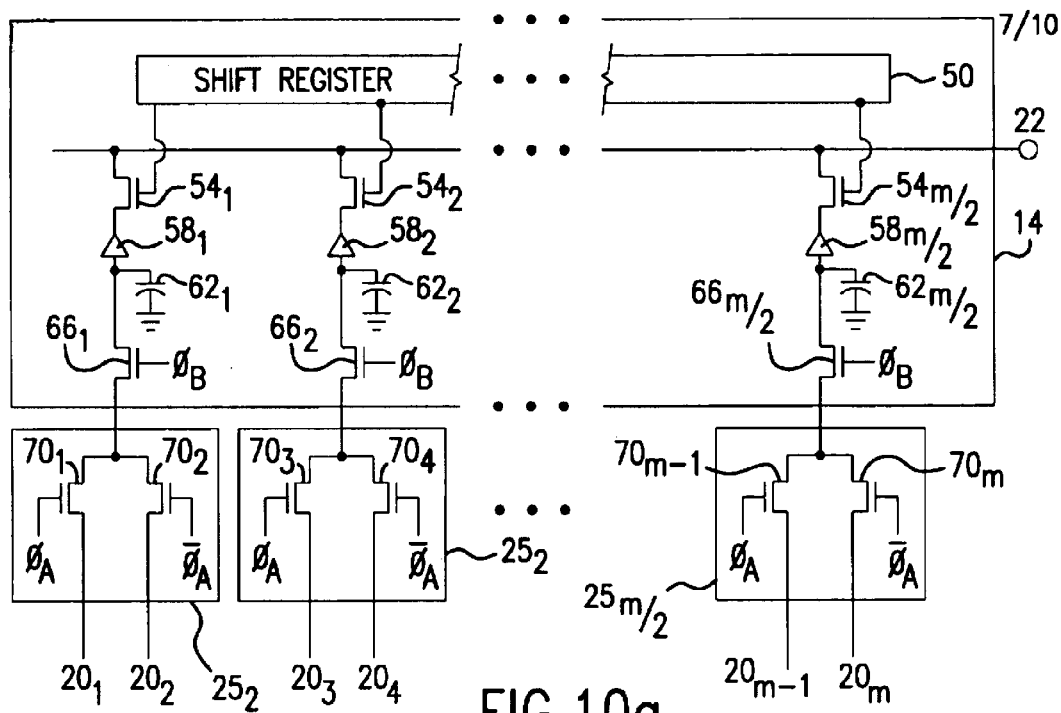
FIGS. 10a and 10b show a schematic diagram illustrating an embodiment of the scanning readout circuits of the embodiment of FIG. 1.
Figure 10B:
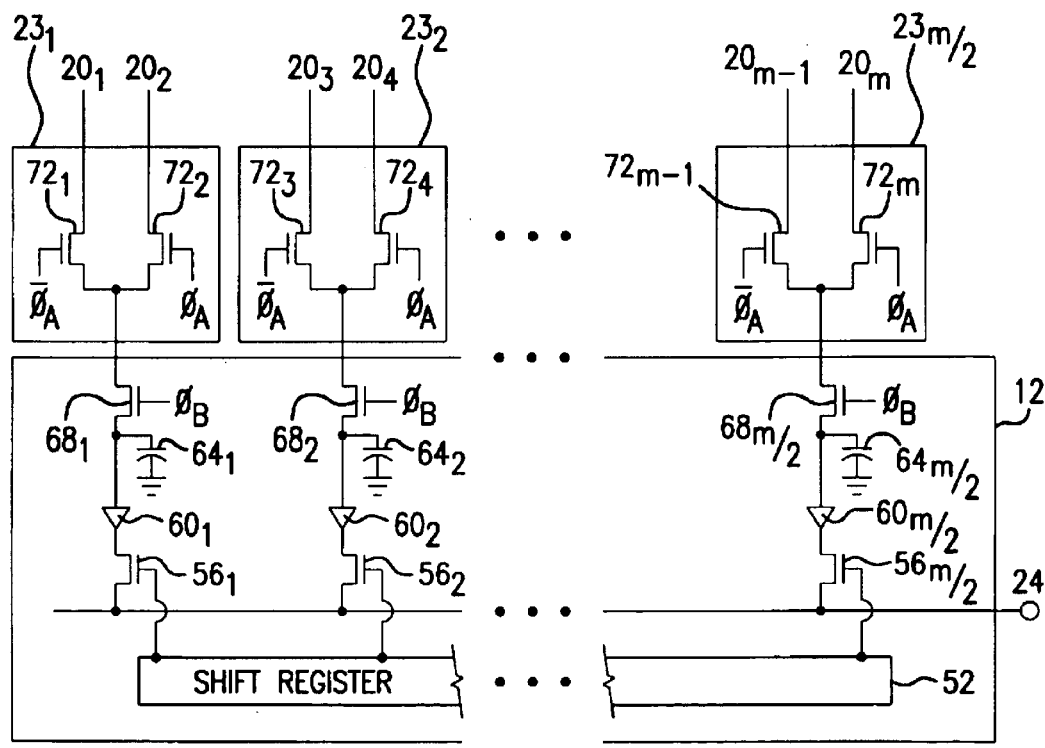

FIGS. 10b and 10a show an embodiment of the scanning readout circuits 12 and 14 of the embodiment shown in FIG. 1. Switches 23 and 25 receive each of the column sense lines $20_l$ through $20_m$. During each scanning interval, a voltage is applied to a selected one of the row select lines 16 (FIGS. 1 and 7) at a corresponding row. This applies the voltage at each of the photodiodes 130 (FIG. 8) in the selected row to a corresponding column sense line 20 (see FIGS. 8 and 9).

Referring again to FIGS. 10a and 10b, each of the column sense lines $20_l$ through $20_m$ are received at a corresponding switch transistor 70 of a switch 25, and at a switch transistor 72 of a switch 23. The switch transistors 70 and 72 are switched on or off by the signal $\phi_A$ and its complement signal $\overline{\Phi}_A$. As discussed above, during any particular scanning interval, the scanning readout circuits 12 and 14 each extract voltage information from photodiodes in the same row in the imaging array 10 or imaging array 11.

While the scanning readout circuit 12 is receiving image data from odd column sense lines 20 (i.e., column sense lines $20_1$, $20_3$, etc.), the scanning readout circuit 14 is receiving image data from the even column sense lines 20 (i.e., column lines $20_2$, $20_4$, etc.). In such an interval, when the scanning readout circuit 12 is to read values from the odd column sense lines 20 and the scanning readout circuit 14 is to read values from the even column sense lines 20, the value of $\overline{\Phi}_A$ is high to turn on the switch transistors $70_2$, $70_4$, etc. (corresponding to the even column sense lines 20) and to turn on the switch transistor $72_1$, $72_3$, etc. (corresponding to the odd column sense lines 20). Meanwhile, the value of $\phi_A$ is low to turn off the switch transistors $70_1$, $70_3$, etc. (to decouple the odd column sense lines 20 from the scanning readout circuit 14) and to turn off the switch transistors $72_2$, $72_4$, etc. (to decouple the even column sense lines 20 from the scanning readout circuit 12).

In a subsequent scanning interval, $\phi_A$ is high and $\overline{\Phi}_A$ is low. This enables select switch transistors $70_1$, $70_3$, etc. to couple the odd column sense lines 20 to the scanning readout circuit 14 and enables transistors $72_1$, $72_3$, etc. to couple the even column sense lines 20 to the scanning readout circuit 12. Since $\overline{\Phi}_A$ is low, the switch transistors $70_2$, $70_4$, etc. corresponding to the even column sense lines 20 are turned off (to decouple the even column sense lines 20 from the scanning readout circuit 14), and the switch transistors $72_1$, $73_2$, etc. corresponding to the odd column sense lines are turned off (to decouple the odd column sense lines 20 from the scanning readout circuit 12).

A switch transistor 66 and corresponding capacitor 62 form a sample and hold circuit in the scanning readout circuit 14. Similarly, each transistor 68 and corresponding capacitor 64 form a sample and hold circuit at the scanning readout circuit 12. At each scanning interval, the signal $\phi_B$ is enabled for an appropriate sampling interval to turn on the transistors $66_1$ through $66_{m/2}$ and turn on the transistors $68_1$ through $68_{m/2}$. This causes a sampling of the voltage at the corresponding photodiode 130 (FIG. 8) for storage at either a corresponding capacitor 62 at the scanning readout circuit 14 or corresponding capacitor 64 at the scanning readout circuit 12, depending on where the photodiode 130 is located within the selected row.

Scanning readout circuits 12 and 14 include shift registers 50 and 52. Shift registers 50 and 52 preferably have a length of m/2 and an output at each location. The shift registers 50 and 52 are preferably loaded with a single "1" at one location, and loaded with "0s" at the remaining locations. During each scanning interval following the assertion of the $\phi_B$ signal to sample the voltage at the photodiodes, the single "1" in the shift register 50 is shifted sequentially to all locations and provided as an output to the gate of a corresponding switch transistor 54, applying a high signal to the gate to turn on transistor 54. When a switch transistor 54 is turned on, the voltage stored at the corresponding capacitor 62 is coupled to the output line 22 through a buffer amplifier 58. The buffer amplifier 58 preferably provides sufficient output impedance to the output bus 22 to quickly drive the output bus through downstream processing described below with reference to FIG. 11. A similar function is performed in the scanning readout circuit 12 in which a single "1" in the shift register 52 is sequentially shifted through the length of the shift register 52 once following the assertion of the $\phi_B$ signal to apply the voltages stored at the capacitors 64 to the output bus 24.

Figure 11:
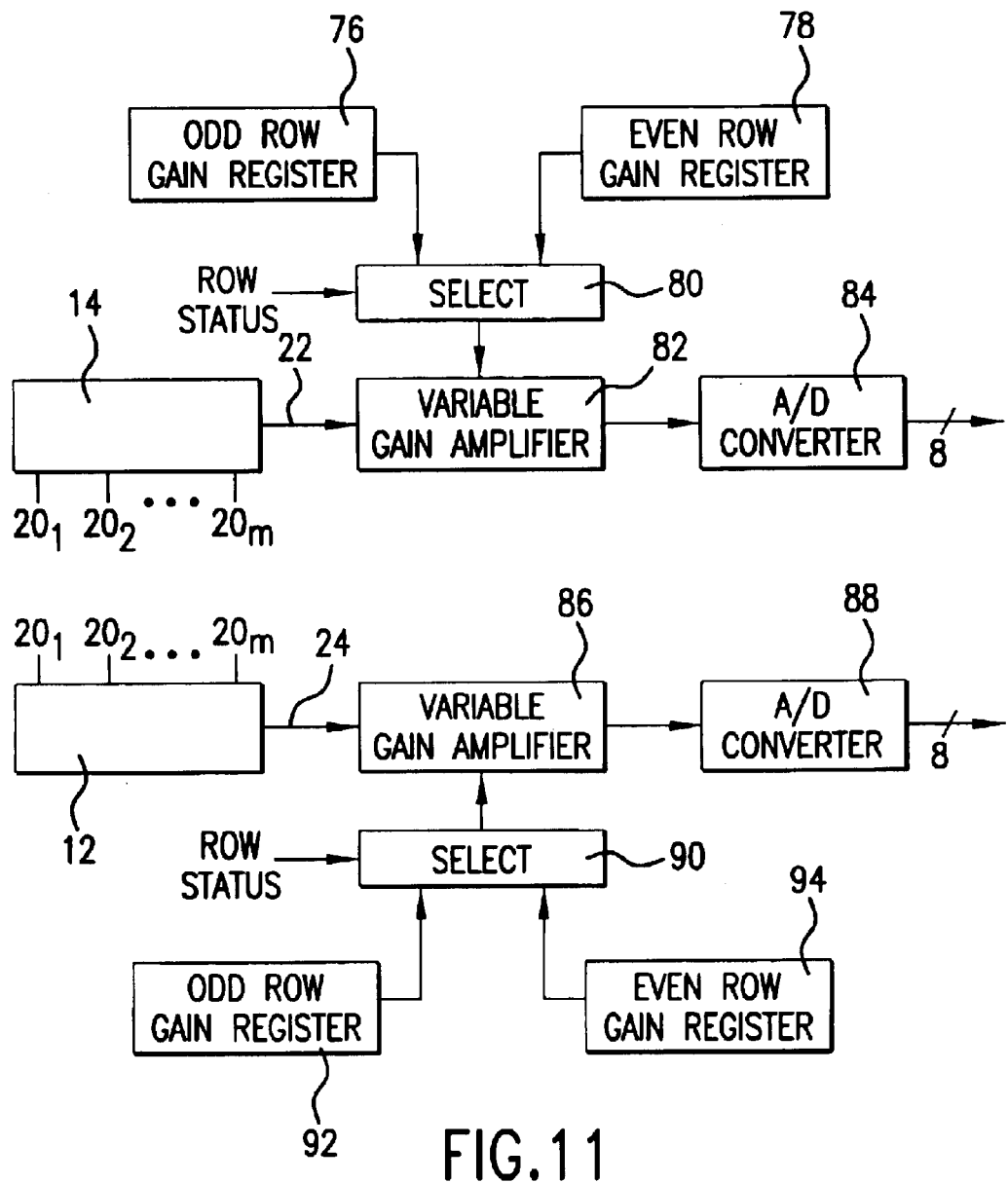
FIG. 11 show a schematic diagram illustrating an embodiment of downstream processing for the scanning readout circuits illustrated in FIGS. 10a and 10b.

FIG. 11 is a block diagram illustrating an embodiment which is used to process signals from the output bus 22 of the scanning readout circuit 14, and signals from the output bus 24 of the scanning readout circuit 12. These signals are processed to provide binary values which are representative of the photon energy collected by the photodiodes 130 and capacitors 131 during exposure. When the voltage at a capacitor 62 in the scanning readout circuit 14 is coupled to the output bus 22 through a corresponding switch transistor 54, a variable gain amplifier 82 applies a gain to the signal which is then digitized at an analog-to-digital converter 84. As discussed above, in preferred embodiments, all of the output values applied to the output bus 22 during any particular scanning interval are all representative of an intensity of photo exposure on pixels of the same color. For example, referring to the discussion above with reference to FIG. 1, the output values on the output bus 24 may be all red pixel output values or all blue pixel output values during alternating scanning intervals (or, all green pixel output values or all white pixel output values during alternating scanning intervals).

When the scanning readout circuit 12 is outputting all red pixel values on odd scanning intervals and all blue pixel values on the remaining even scanning intervals, a selection circuit 90 can load the contents of an odd row gain register 92 to the variable gain amplifier 86 to program the variable gain amplifier 86 to apply an appropriate gain uniformly to all output values of red pixels. For the even rows, the selection circuit 90 may then load the contents of an even row gain register 94 to the variable gain amplifier 86 to uniformly apply a gain to output values of blue pixels. Thus, the selection circuit 90 will control the variable gain amplifier 86 to provide two different gains at alternating intervals, each gain to be applied to intensity values of a corresponding color.

Similarly, when the scanning readout circuit 14 is outputting all green pixels during odd scanning intervals and all white pixel values during the even scanning intervals, a selection circuit 80 can load the contents of an odd row gain register 76 to the variable gain amplifier 82 to program the variable gain amplifier 82 to apply an appropriate gain to all output values of green pixels. For the even rows, the selection circuit 80 may then load the contents of an even row gain register 84 to program the variable gain amplifier 82 to uniformly apply a gain to output values of white pixels.

This feature can be useful in, for example, normalizing the intensity of output values of different colored pixels which may be biased due to the non-uniform physical sensor response characteristics as shown in FIG. 6*b*. For example, FIG. 6*b* shows that the sensor response at red pixels is not as high as the sensor response at the blue or green pixels. Thus, for output values from red pixels, the variable gain amplifier 86 may provide a higher gain than to the output values from the blue pixels in the alternating scanning intervals. An even smaller gain may be applied by a variable gain amplifier 82 to the output values on output bus 22 from green pixels. Since the sensor response for the unfiltered white pixels is significantly greater than the sensor response at the green pixels (FIG. 6*b*), the gain uniformly applied to the intensity values originating at the white pixels during the even row extraction intervals is preferably lower than the gains uniformly applied to the intensity values originating at the green pixels during the odd row extraction intervals.

While the embodiment of FIG. 11 is illustrated above in connection with processing image data extracted from the imaging array 10, this embodiment is also applicable for applying uniform gains to intensity values extracted from the imaging array 11. Here, the variable gain amplifiers 82 and 86 preferably apply uniform gains to each pixel in the sets of cyan, magenta, yellow and white pixels. The selection of these gains for each pixel of the same color is preferably based upon the absorption characteristics (not shown) of these pixels having the color, among other factors.

In alternative embodiments, the scanning readout circuits 12 and 14, and the switches 23 and 25 are replaced with readout circuitry which is more directly coupled to the pixels in the imaging arrays 10 and 11. Such a readout architecture may consist of four separate readout circuits (not shown), each readout circuit being coupled only to pixels of a corresponding color. For example, a separate readout circuit may be employed for reading out each set of red, blue, green and white pixels of imaging array 10. Similarly, a separate readout circuit may be employed for reading out each set of cyan, magenta, yellow and white pixels of imaging array 11.

According to an embodiment of the architecture with four separate readout circuits, the four separate readout circuits are coupled to each of the four sides of a rectangular imaging array. Applied to an imaging array with red, blue, green and white pixels in a pattern such as that of the imaging array 10 shown in FIG. 1, a first readout circuit is coupled to the top of the imaging array to receive intensity values from all of the green pixels, a second readout circuit is coupled to the bottom of the array to receive intensity values from all of the white pixels, a third readout circuit is coupled to the left side of the array to receive intensity values from all of the red pixels and a fourth readout circuit to receive intensity values from all of the blue pixels.

A first set of alternating column sense lines couples each of the green pixels to the top readout circuit and a second set of alternating column sense lines interleaved with the first set of column sense lines couples each of the white pixels to the bottom readout circuit. Each of a first set of row select lines is enabled on extraction intervals to provide the intensity values of the green pixels to the top readout circuit on an alternating row by row basis on the first set of column sense lines. Each of a second set of row select lines (interleaved with the first set of row select lines) is enabled on extraction intervals to provide the intensity values of the white pixels to the bottom readout circuit on an alternating row by row basis on the second set of column sense lines.

A first set of alternating row sense lines couples each of the red pixels to the left readout circuit and a second set of alternating row sense lines (interleaved with the first set of alternating row sense lines) couples each of the blue pixels to the right readout circuit. Each of a first set of column select lines is enabled on extraction intervals to provide the intensity values of the red pixels to the left readout circuit on an alternating column by column basis on the first set of row sense lines. Each of a second set of column select lines (interleaved with the first set of column select lines) is enabled on extraction intervals to provide the intensity values of the blue pixels to the right readout circuit on an alternating column by column basis on the second set of row sense lines.

It can be seen that this architecture with four readout circuits can also be applied to extracting intensity values from other four color imaging arrays such as imaging arrays with cyan, magenta, yellow and white pixels in a pattern such as that of the imaging array 11 shown in FIG. 7. Here, each of the four readout circuits receives the intensity values all pixels in the array of a color corresponding to the readout circuit. Each of the four readout ciruits may then provide an output to a separate amplifier to apply a uniform gain to each of the intensity values extracted from the same color pixel in a manner illustrated above with reference to FIG. 11.

Figure 12:
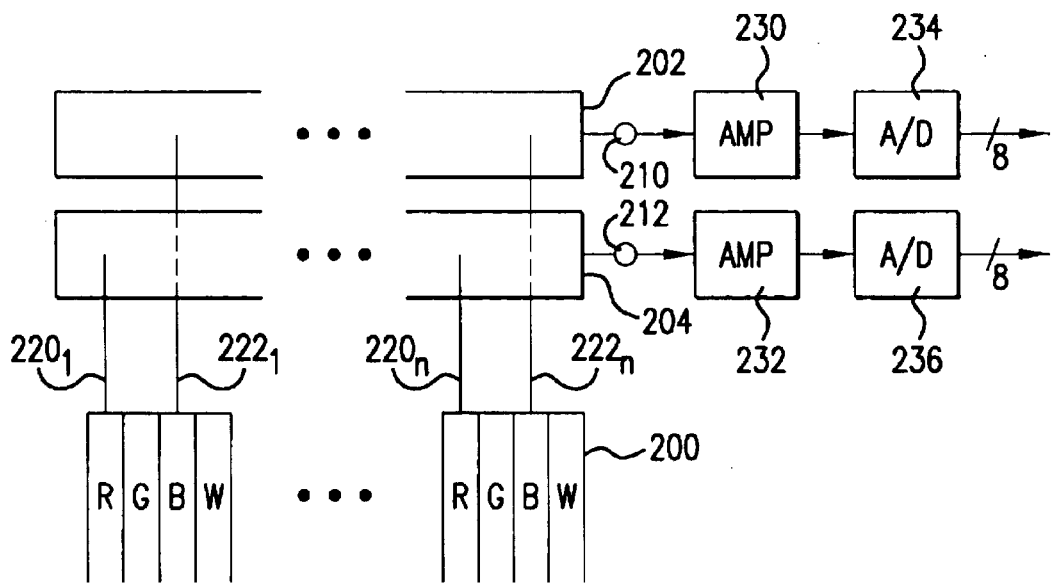
FIGS. 12 and 13 show alternative embodiments of an imaging array with unicolor columns of pixels.
Figure 12:
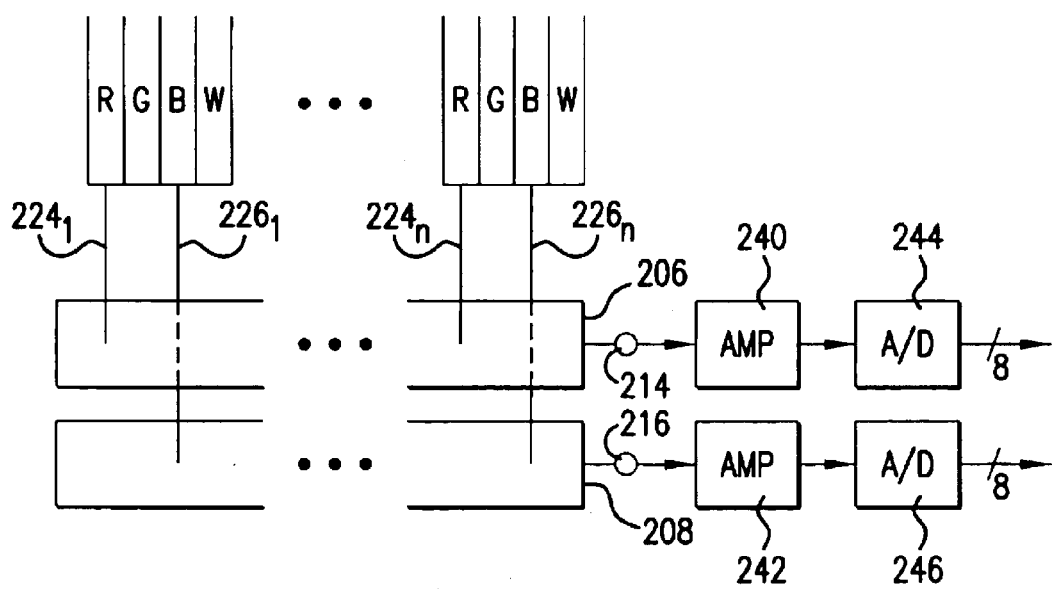

FIG. 12 shows another embodiment of an imaging array having red, green, blue and white pixels. Here, an imaging array 200 is made up of columns of pixels of the same color. In particular, the imaging array 200 includes alternating pixel wide columns of red, green, blue and white pixels (denoted by the letters R, G, B and W). In a manner similar to the formation of pixels illustrated above with reference to FIGS. 1 through 5, the red, green and blue columns of pixels are formed by depositing a transmissive filter over the associated pixel regions in each column, and the white columns of pixels are formed by maintaining an absence of a transmissive filter over the pixels in these columns. The imaging array 200 includes 4×n such pixel wide columns of unicolor pixels. Scanning readout circuits 202, 204, 206 and 208 each extracts color information from pixels of an associated color. An n number of column sense lines 220 couples each of the red pixel columns to the scanning readout circuit 204. An n number of column sense lines 222 couple each of the blue pixel columns to the scanning readout circuit 202. An n number of column sense lines 224 couple each of the green pixel columns to the scanning readout circuit 206. Finally, an n number of column sense lines 226 couple each of the white pixels columns to the scanning readout circuit 208. As discussed above in connection with the embodiment shown in FIG. 1, row select lines (not shown) are enabled to allow for the extraction of pixels on a row by row basis on extraction intervals. Accordingly, upon enabling a row select line of a particular row in the imaging array 200, all intensity values for each pixel in the selected row is provided to the scanning readout circuit associated with the color of the pixel.

Figure 13:
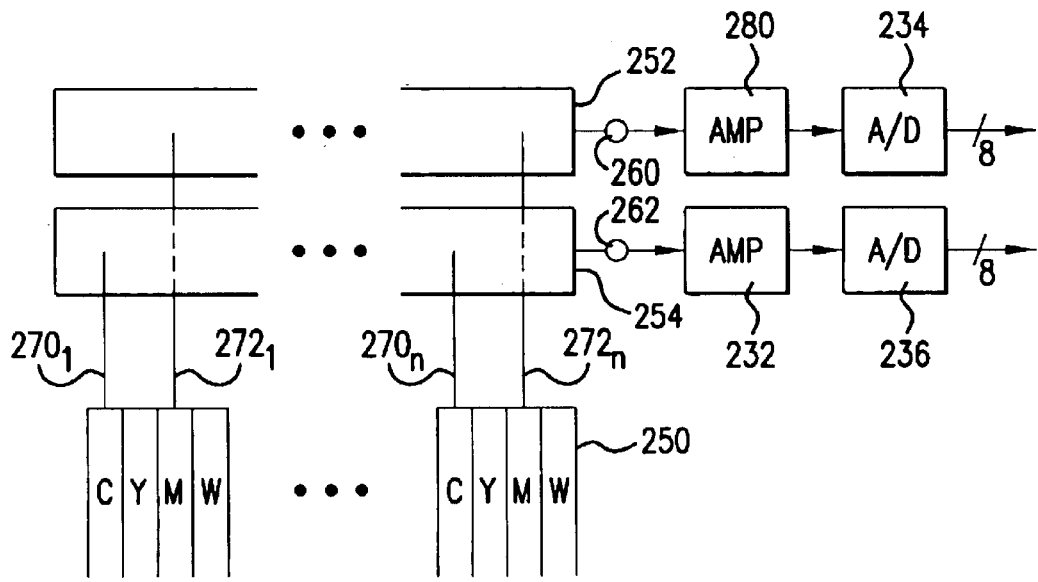
Figure 13:
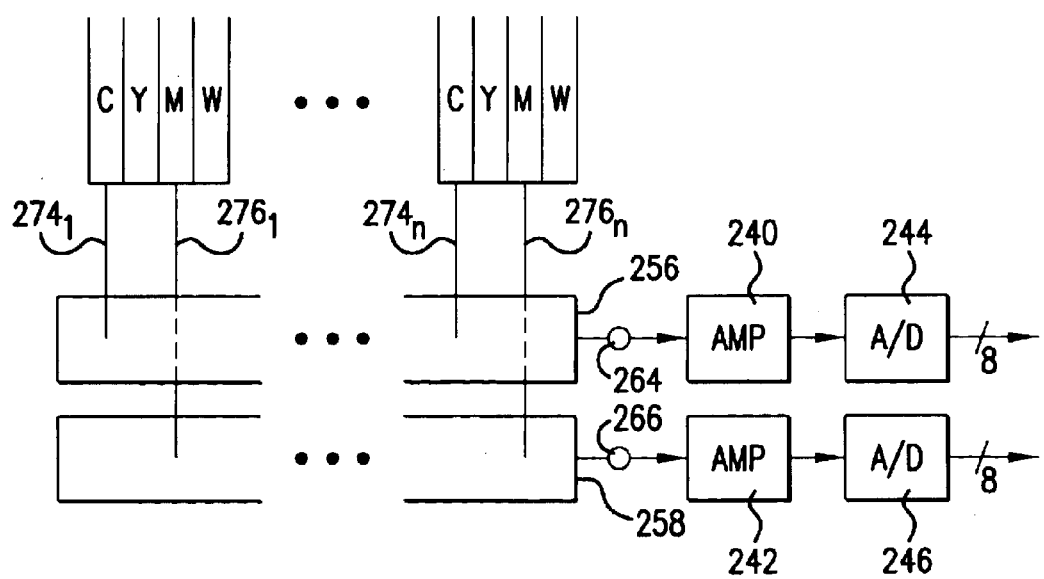

FIG. 13 illustrates a similar embodiment with an imaging array 250 with pixel wide columns of unicolor pixels for cyan, yellow, magenta and white (denoted by the letters C, Y, M and W). In a manner similar to the formation of pixels illustrated above with reference to FIG. 7, the cyan, yellow and magenta columns of pixels are formed by depositing a transmissive filter over the associated pixel regions in each column, and the white columns of pixels are formed by maintaining an absence of a transmissive-filter over the pixels in these columns. The imaging array 250 is 4×n columns wide. An n number of column sense lines 270 couple the cyan pixel columns to the scanning readout circuit 254. An n number of column sense lines 272 couple the magenta pixel columns to the scanning readout circuit 252. An n number of column sense lines 274 couple the yellow pixel columns to the scanning readout circuit 256. Finally, an n number of column sense lines 276 couple the white pixel columns to the scanning readout circuit 258. Each of the scanning readout circuits 252, 256 and 258 extract intensity values from the corresponding colored pixels on a row-by-row basis in the same manner as discussed above in connection with the extraction of color information from the imaging array 200 shown in FIG. 12.

With the embodiments illustrated with reference to FIGS. 12 and 13, a separate gain amplifier may be dedicated to each of the individual scanning readout circuits. Each separate gain amplifier may then apply a uniform gain to all of the intensity values extracted from its associated scanning readout circuit in a manner similar to that illustrated above with reference to FIG. 11. The output sampled from each of the gain amplifiers may then form a separate sub-image which may be further processed in downstream processing.

As described above, the imaging array 10 has pixels or light-sensitive elements which are sensitive to blue light, red light and green light through transmissive filters deposited over a substrate. The imaging array 11 has pixels or light-sensitive elements which are sensitive to cyan light, magenta light and yellow light. The imaging array 10 and imaging array 11 also include white pixels by having an absence of any transmissive filter deposited at select pixel locations uniformly distributed throughout the imaging array 10 and imaging array 11. These white pixels permit the extraction of additional color information from objects in digital photography.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An imaging array comprising:
   a first set of light-sensitive elements, each of the first set of light-sensitive elements having a sensitivity to energy in one of a plurality of spectral regions which are substantially distinct from one another;
   a second set of light-sensitive elements having a sensitivity to energy in a spectral region which includes substantially all of the spectral regions of the first set of light-sensitive elements, wherein the second set of light-sensitive elements are distributed among the first set of light-sensitive elements substantially uniformly throughout the array;
   at least one signal generating unit for generating signals representative of a quantity of energy collected over a exposure period at each of the light-sensitive elements; and
   at least one gain adjusting unit for scaling the signals representative of the quantity of the energy collected at the second set of light-sensitive elements based upon a photo absorbtance profile associated with the second set of light-sensitive elements in comparison with a photo absorbtance profile associated with a light-sensitive element of at least one of the spectral regions corresponding to one of the first set of light-sensitive elements.

2. The imaging array of claim 1, wherein the second set of light-sensitive elements have a sensitivity to energy in a substantially white spectral region and each of the first set of light-sensitive elements are sensitive to energy in one of red, blue and green spectral regions.

3. The imaging array of claim 1, wherein the second set of light-sensitive elements have a sensitivity to energy in a substantially white spectral region and each of the first set of light-sensitive elements are sensitive to energy in one of cyan, magenta and yellow spectral regions.

4. The imaging array of claim 1, wherein the first and second sets of light-sensitive elements include photodiodes which are formed in a semiconductor substrate as part of a CMOS device.

5. The imaging array of claim 4, wherein the photodiodes of the light-sensitive elements are formed at exposure regions corresponding to light-sensitive elements, wherein the first set of light-sensitive elements includes transmissive filters deposited over the exposure regions corresponding to the first set of light-sensitive elements, and wherein there is an absence of any transmissive filter deposited over the exposure regions corresponding to the second set of light-sensitive elements.

6. A method of manufacturing an imaging array, the method comprising:
   forming a plurality of photodiodes in a semiconductor substrate, each photodiode corresponding to an exposure region on the semiconductor substrate;
   depositing a transmissive filter over each of a first set of exposure regions corresponding to a first set of light-sensitive elements;
   maintaining an absence of a transmissive filter over each of a second set of exposure regions corresponding to a second set of light-sensitive elements;
   forming at least one signal generating unit for generating signals representative of a quantity of energy collected over a exposure period at each of the light-sensitive elements; and
   forming at least one gain adjusting unit for scaling the signals representative of the quantity of the energy collected at the second set of light-sensitive elements based upon a photo absorbtance profile associated with the second set of light-sensitive elements in comparison with a photo absorbtance profile associated with a light-sensitive element of at least one of the spectral regions corresponding to one of the first set of light-sensitive elements.

7. The method of claim 6, the method further including distributing the second set of light-sensitive elements substantially uniformly among the first set of light-sensitive elements.

8. The method of claim 6, wherein the step of depositing a transmissive filter over each of a the first set of exposure regions further includes depositing the transmissive filters to form light-sensitive elements responsive to photon energy in a plurality of spectral regions selected from cyan, magenta and yellow spectral regions,
   wherein the absence of a transmissive filter over the second set of exposure regions forms light sensitive elements responsive to photon energy in a wideband spectral region.

9. The method of claim 6, wherein the step of depositing a transmissive filter over each of a the first set of exposure regions further includes depositing the transmissive filters to form light-sensitive elements responsive to photon energy in a plurality of spectral regions selected from red, blue and green spectral regions, wherein the absence of a transmissive filter over the second set of exposure regions forms light sensitive elements responsive to photon energy in a wideband spectral region.

10. An imaging array comprising:

a substrate including a plurality of light-sensitive elements, each of the light sensitive elements including energy collection circuitry formed in the substrate for collecting photon energy incident on an exposure surface of the substrate, the exposure surface having an absorptance to photon energy in a wideband spectral region;

a plurality of transmissive light filters formed over the exposure surface on areas corresponding to a first group of the light-sensitive elements, each of the selected ones of the light-sensitive elements in a first group having a corresponding transmissive light filter formed thereon for substantially blocking photon energy of wavelengths which are not in a spectral region defined by the corresponding transmissive light filter and permitting the energy collection circuitry to collect photon energy having a wavelength within the spectral region defined by the corresponding transmissive light filter, wherein there is an absence of any transmissive light filters formed over the exposure surface on areas corresponding to a remaining second group of the light-sensitive elements to enable the energy collection circuitry of each of the remaining second group of light-sensitive elements to collect photon energy incident on the exposure surface of the substrate having a wavelength in the wideband spectral region;

at least one signal generating unit for generating signals representative of a quantity of photon energy collected over a exposure period at each of the light-sensitive elements; and at least one gain adjusting unit for scaling the signals representative of the quantity of the photon energy collected at the second set of light-sensitive elements based upon a photo absorbtance profile associated with the second set of light-sensitive elements in comparison with a photo absorbtance profile associated with a light-sensitive element of at least one of the spectral regions corresponding to one of the first set of light-sensitive elements.

11. The imaging array of claim 10, wherein each of the transmissive light filters permit the collection of energy having a wavelength within a spectral region corresponding to one of red light, blue light and green light.

12. The imaging array of claim 10, wherein each of the transmissive light filters permit the collection of energy having a wavelength within a spectral region corresponding to one of cyan light, magenta light and yellow light.

13. The imaging array of claim 10, wherein the energy collection circuitry for each of the light-sensitive elements in the first group collects photon energy having a wavelength within a spectral region corresponding to one of red light, green light and blue light, and the energy collection circuitry of the remaining light-sensitive elements in the second group collects photon energy having a wavelength within a spectral region including at least a union of the spectral regions corresponding to red light, green light and blue light.

14. The imaging array of claim 10, wherein the energy collection circuitry for each of the light-sensitive elements in the first group collects photon energy having a wavelength within a spectral region corresponding to one of cyan light, magenta light and yellow light, and the energy collection circuitry of the remaining light-sensitive elements in the second group collects photon energy having a wavelength within a spectral region including at least a union of the spectral regions corresponding to cyan light, magenta light and yellow light.

15. The imaging array of claim 10, wherein the energy collection circuitry for each of the light-sensitive elements includes a photodiode formed on the substrate.

16. A method of capturing a photographic image of an object formed onto an imaging array, the object reflecting photon energy, the method comprising:

exposing the imaging array to the photon energy reflected from the object for an exposure period;

collecting the photon energy over the exposure period at a first set of light-sensitive elements formed onto the imaging array, each of the first set of light sensitive elements collecting photon energy having wavelengths within a spectral region corresponding to a selected one of red light, blue light and green light; and collecting the photon energy over the exposure period at a second set of light-sensitive elements formed onto the imaging array, each of the second set of light-sensitive elements collecting photon energy having wavelengths within a wideband spectral region including at least a union of the spectral regions corresponding to red light, blue light and green light;

generating signals representative of a quantity of the photon energy collected over the exposure period at each of the light-sensitive elements; and scaling the signals representative of the quantity of the photon energy collected at the second set of light-sensitive elements based upon a photo absorbtance profile associated with the second set of light-sensitive elements in comparison with a photo absorbtance profile associated with a light-sensitive element of at least one of the spectral regions corresponding to red light, blue light and green light.

17. The method of claim 16, the method further comprising:

forming data representative of three sub-images based upon the signal representative of the quantity of the photon energy collected over the exposure period at each of the first set of light sensitive elements, the data representative of each of the three sub-images having values representative of an intensity of exposure at a location in the sub-image; and forming data representative of a fourth sub-image based upon the scaled signals representative of the quantity of the photon energy collected at the second set of light-sensitive elements, the data representative of the fourth sub-image having values representative of an intensity of exposure at a location in the fourth sub-image.

18. A method of capturing a photographic image of an object formed onto an imaging array, the object reflecting photon energy, the method comprising:

exposing the imaging array to the photon energy reflected from the object for an exposure period;

collecting the photon energy over the exposure period at a first set of light-sensitive elements formed onto the imaging array, each of the first set of light sensitive elements collecting photon energy having wavelengths within a spectral region corresponding to a selected one of cyan light, magenta light and yellow light;

collecting the photon energy over the exposure period at a second set of light-sensitive elements formed onto the imaging array, each of the second set of light-sensitive elements collecting photon energy having wavelengths within a wideband spectral region including at least a union of the spectral regions corresponding to cyan light, magenta light and yellows light; and generating signals representative of a quantity of the photon energy collected over the exposure period at each of the light-sensitive elements; and scaling the signals representative of the quantity of the photon energy collected at the second set of light-sensitive elements based upon a photo absorbtance profile associated with the second set of light-sensitive elements in comparison with a photo absorbtance profile associated with a light-sensitive element of at least one of the spectral regions corresponding to cyan light, magenta light and yellow light.

19. The method of claim 18, the method further comprising:

forming data representative of three sub-images based upon the signal representative of the quantity of the photon energy collected over the exposure period at each of the first set of light sensitive elements, the data representative of each of the three sub-images having values representative of an intensity of exposure at a location in the sub-image; and forming data representative of a fourth sub-image based upon the scaled signals representative of the quantity of the photon energy collected at the second set of light-sensitive elements, the data representative of the fourth sub-image having values representative of an intensity of exposure at a location in the fourth sub-image.

20. A method of capturing a photographic image of an object formed onto an imaging array, the object reflecting photon energy, the method comprising:

exposing the imaging array to the photon energy reflected from the object for an exposure period;

collecting the photon energy over the exposure period at a first set of light-sensitive elements formed onto the imaging array, each of the first set of light sensitive elements collecting photon energy having wavelengths within a spectral region corresponding to a selected one of red light, blue light and green light;

collecting the photon energy over the exposure period at a second set of light-sensitive elements formed onto the imaging array, each of the second set of light-sensitive elements collecting photon energy having wavelengths within a wideband spectral region including at least a union of the spectral regions corresponding to red light, blue light and green light, wherein a plurality of 2×2 basic units is formed from three light-sensitive elements from the first set of light-sensitive elements and one light-sensitive element from the second set of light-sensitive elements;

generating signals representative of a quantity of the photon energy collected over the exposure period at each of the light-sensitive elements; and scaling the signals representative of the quantity of the photon energy collected at the second set of light-sensitive elements based upon a photo absorbtance profie associated with the second set of light-sensitive elements in comparison with a photo absorbtance profile associated with a light-sensitive element of at least one of the spectral regions corresponding to red light, blue light and green light.

21. A method of capturing a photographic image of an object formed onto an imaging array, the object reflecting photon energy, the method comprising:

exposing the imaging array to the photon energy reflected from the object for an exposure period;

collecting the photon energy over the exposure period at a first set of light-sensitive elements formed onto the imaging array, each of the first set of light sensitive elements collecting photon energy having wavelengths within a spectral region corresponding to a selected one of red light, blue light and green light;

collecting the photon energy over the exposure period at a second set of light-sensitive elements formed onto the imaging array, each of the second set of light-sensitive elements collecting photon energy having wavelengths within a wideband spectral region including at least a union of the spectral regions corresponding to red light, blue light and green light, wherein a plurality of 2×2 basic units is formed from three light-sensitive elements from the first set of light-sensitive elements and one light-sensitive element from the second set of light-sensitive elements;

forming data representative of three sub-images based upon the signal representative of the quantity of the photon energy collected over the exposure period at each of the first set of light sensitive elements, the data representative of each of the three sub-images having values representative of an intensity of exposure at a location in the sub-image; and forming data representative of a fourth sub-image based upon the scaled signals representative of the quantity of the photon energy collected at the second set of light-sensitive elements, the data representative of the fourth sub-image having values representative of an intensity of exposure at a location in the fourth sub-image.

22. A method of capturing a photographic image of an object formed onto an imaging array, the object reflecting photon energy, the method comprising:

exposing the imaging array to the photon energy reflected from the object for an exposure period;

collecting the photon energy over the exposure period at a first set of light-sensitive elements formed onto the imaging array, each of the first set of light sensitive elements collecting photon energy having wavelengths within a spectral region corresponding to a selected one of cyan light, magenta light and yellow light;

collecting the photon energy over the exposure period at a second set of light-sensitive elements formed onto the imaging array, each of the second set of light-sensitive elements collecting photon energy having wavelengths within a wideband spectral region including at least a union of the spectral regions corresponding to cyan light, magenta light and yellows light, wherein a plurality of 2×2 basic units is formed from three light-sensitive elements from the first set of light-sensitive elements and one light-sensitive element from the second set of light-sensitive elements;

generating signals representative of a quantity of the photon energy collected over the exposure period at each of the light-sensitive elements; and scaling the signals representative of the quantity of the photon energy collected at the second set of light-sensitive elements based upon a photo absorbtance profie associated with the second set of light-sensitive elements in comparison with a photo absorbtance profile associated with a light-sensitive element of at least one of the spectral regions corresponding to cyan light, magenta light and yellow light.

23. The method of claim 22, the method further comprising:

forming data representative of three sub-images based upon the signal representative of the quantity of the photon energy collected over the exposure period at each of the first set of light sensitive elements, the data representative of each of the three sub-images having values representative of an intensity of exposure at a location in the sub-image; and forming data representative of a fourth sub-image based upon the scaled signals representative of the quantity of the photon energy collected at the second set of light-sensitive elements, the data representative of the fourth sub-image having values representative of an intensity of exposure at a location in the fourth sub-image.

\* \* \* \* \*